United States Patent [19]
Look et al.

[11] Patent Number: 4,816,755
[45] Date of Patent: Mar. 28, 1989

[54] METHOD AND APPARATUS FOR MEASURING PHOTORESISTIVITY AND PHOTO HALL-EFFECT OF SEMICONDUCTOR WAFERS

[75] Inventors: David C. Look; Eileen Pimentel, both of Dayton, Ohio

[73] Assignee: Wright State University, Dayton, Ohio

[21] Appl. No.: 163,001

[22] Filed: Mar. 2, 1988

[51] Int. Cl.$^4$ ............................................. G01R 31/00
[52] U.S. Cl. ................................. 324/158 R; 324/64; 324/158 D; 324/501
[58] Field of Search .................. 324/64, 71.1, 158 D, 324/158 R, 501, 522, 525, 526, 73 R; 250/492.2, 341; 356/391, 394

[56] References Cited

U.S. PATENT DOCUMENTS

| | | | |
|---|---|---|---|
| 4,158,806 | 6/1979 | Kotylev et al. | 324/64 |
| 4,166,244 | 8/1979 | Woods et al. | 324/64 |
| 4,213,086 | 7/1980 | Iida et al. | 324/64 |
| 4,286,215 | 8/1981 | Miller | 324/158 D |
| 4,301,409 | 11/1981 | Miller et al. | 324/158 D |
| 4,346,348 | 8/1982 | Bartoli et al. | 324/158 D |
| 4,515,480 | 5/1985 | Miller et al. | 356/394 |
| 4,581,576 | 4/1986 | Wang | 324/158 D |

OTHER PUBLICATIONS

"Dislocation Density and Sheet Resistance Variations Across Semi-Insulating GaAS Wafers", by Blunt et al., IEEE Irons. on Electron Dev., vol. ED-29, #7, 7/82, pp. 1039–1044.

"Sheet Resistance, Monitor for Deposition of Thin Films" by Holmwood et al., IBM Tech. Disc. Bull., vol. 9, #3, pp. 247–248, 8/66, 324–64.

Primary Examiner—Reinhard J. Eisenzopf
Assistant Examiner—W. Burns
Attorney, Agent, or Firm—Killworth, Gottman, Hagan & Schaeff

[57] ABSTRACT

A method and apparatus for measuring the characteristics of a photoconductive semiconductor wafer. The apparatus comprises a light source for directing light of substantially uniform intensity toward one surface of the wafer. The apparatus further comprises masking apparatus, interposed between the wafer and light source, for transmitting the light to the wafer in the shape of a cross formed by a pixel of light at the intersection of the cross and four paths extending outwardly from the pixel to the periphery of the wafer. The apparatus also comprises a first set of contacts for providing an electrical contact with the paths of light. The apparatus further comprises control apparatus connected to each of the contacts of the first set, for applying current successively to each of four sets of adjacent paths of light and measuring the voltage across the opposing set of adjacent paths in response to each application of current. As a result, the resistivity of a first portion of the wafer illuminated by the projection of the pixel of light through the wafer is determined. The apparatus may also comprise a magnet for applying a substantially uniform magnetic field to the other surface of the wafer. As a result, the carrier mobility and carrier concentration of the first portion of the wafer illuminated by the projection of the pixel light are determined.

27 Claims, 3 Drawing Sheets

METHOD AND APPARATUS FOR MEASURING PHOTORESISTIVITY AND PHOTO HALL-EFFECT OF SEMICONDUCTOR WAFERS

This invention was made with Government support under contract F33615-86-C-1062 awarded by the Department of Defense. The Government has certain rights in this invention.

BACKGROUND OF THE INVENTION

The present invention relates to a method and apparatus for measuring characteristics of a photo-conductive semiconductor wafer and, more particularly, to a method and apparatus that measures the resistivity, mobility, and carrier concentration of the semiconductor wafer.

A semi-insulating (SI) semiconductor wafer, such as for example, gallium arsenide (GaAs), is used as a substrate on which circuit elements or other devices are fabricated by epitaxial growth or other methods. After the devices have been fabricated on the substrate, they are tested individually for operational defects which often occur because of the properties of the substrate. Unfortunately, however, the fabrication process represents up to 95% of the cost of the ultimate device. Thus, it would be much more cost effective to test the substrate nondestructively before the fabrication process to avoid unnecessary expense.

Commonly used techniques for testing include standard Hall-effect, photoluminescence, and photo-assisted resistance measurements. To obtain standard Hall-effect measurements, small samples are cut from the substrate. The measurements require a substantial amount of time to prepare the semiconductor sample and ultimately acquire test data. Hence, standard Hall-effect measurement techniques constitute destructive testing that is not really practical. Although photoluminescene can be used for nondestructive testing, measurements must be carried out at very low temperatures. In addition, this technique detects only those imperfections which display a luminescent behavior.

The photo-assisted resistance technique is a nondestructive technique that can be used for measuring semiconductor characteristics. It was first described by R. T. Blunt et al in an article entitled "Dislocation Density and Sheet Resistance Variations Across Semi-Insulating GaAs Wafers" published in the *IEEE Transactions on Electron Devices,* Vol. ED.-29, No. 7, July 1982 and referred to as dark-spot resistance ("DSR") for measuring sheet resistances across semiconductor wafers. The disadvantage of this technique, however, is that it does not measure true resistivity or provide information related to mobility and carrier concentration. Up to now, there have been no nondestructive, topographic methods or apparatus to measure the true resistivity, mobility and carrier concentration characteristics.

Accordingly, there is a need for a method and apparatus for nondestructively measuring the resistivity, carrier mobility and carrier concentration of a semi-insulating semiconductor wafer.

SUMMARY OF THE INVENTION

The present invention meets these needs by providing a method and apparatus for measuring the characteristics of a photoconductive semiconductor wafer. The apparatus comprises light means for directing light of substantially uniform intensity toward one surface of the wafer. The light has a wavelength greater than the absorptive wavelength of the material which comprises the wafer. The apparatus further comprises masking means, interposed between the wafer and the light means, for transmitting the light to the wafer in the shape of a cross formed by a pixel of light at the intersection of the cross and four paths extending outwardly from the pixel to the periphery of the wafer. The apparatus also comprises a first set of contact means, each removably connected to a position on the periphery of the wafer and illuminated by one of the four paths of light, for providing an electrical contact with the paths of light. The apparatus further comprises control means having separate inputs, connected to each of the contact means of the first set, for applying current successively to each of four sets of adjacent paths of light and measuring the voltage across the opposing set of adjacent paths in response to each application of current. As a result, the resisitivity of a first portion of the wafer illuminated by the projection of the pixel of light through the wafer is determined.

The apparatus may also comprise magnetic means for applying a substantially uniform magnetic field to the other surface of the wafer. The control means then applies current successively to each of the two sets of opposing paths of light and measures the voltage across the other set of opposing paths of light in response to each application of current. As a result, the carrier mobility and carrier concentration of the first portion of the wafer illuminated by the projection of the pixel light are determined. The apparatus may also comprise drive means, having an input electrically connected to the control means and an output mechanically connected to the masking means for moving the masking means in a plane substantially parallel to the surface of the wafer so that the pixel of light illuminates successive portions of the wafer. Successive sets of contact means are associated with each successive portion of the wafer and each is removably connected to a position on the periphery of the wafer illuminated by one of the four paths of light. The control means is connected to the successive sets of contact means for applying current to and measuring voltage across the four sets of adjacent paths of light and two sets of opposing paths of light associated with each successive portion of the wafer in the same manner as done for the first portion of the wafer.

The method comprises the steps of illuminating one surface of the wafer with a cross of light of substantially uniform intensity formed by a pixel of light at the intersection of the cross and four paths of light extending outwardly therefrom to the periphery of the wafer at a first set of electrical contacts removably connected to the wafer. The wavelength of the light is greater than the absorptive wavelength of the material which comprises the wafer. The method also comprises the steps of applying current successively to the electrical contacts of the first set of electrical contacts for each of four sets of adjacent paths of light and measuring the voltage across the electrical contacts of the opposing set of adjacent paths of light in response to each application of current to determine the resistivity of the portion of the wafer illuminated by the projection of the pixel of light through the wafer.

The method may further comprise the steps of applying a substantially uniform magnetic field to the other surface of the wafer and applying current successively to the electrical contacts of the first set of electrical contacts for each of two sets of opposing paths of light.

The method further comprises measuring the voltage across the electrical contacts of the other set of opposing paths of light in response to each application of current in order to determine the carrier mobility and carrier concentration of the portion of the wafer illuminated by the projection of the pixel light. The method also comprises the steps of moving the cross of light so that the pixel of light illuminates successive portions of the wafer and repeating all of the previous steps for each successive portion to generate a map of the resistivities, carrier mobilities, and carrier concentrations for the surface of the wafer.

Accordingly, it is an object of the present invention to provide a method and apparatus for nondestructively measuring the resistivity, carrier mobility, and carrier concentration of portions of a semiconductor wafer so that the lateral homogeneity can be evaluated; and to provide a map showing these characteristics across the surface of the wafer. Other objects and advantages of the invention will be apparent from the following description, the accompanying drawings, and the appended claims.

DETAILED DESCRIPTION OF THE INVENTION

Figure 1:
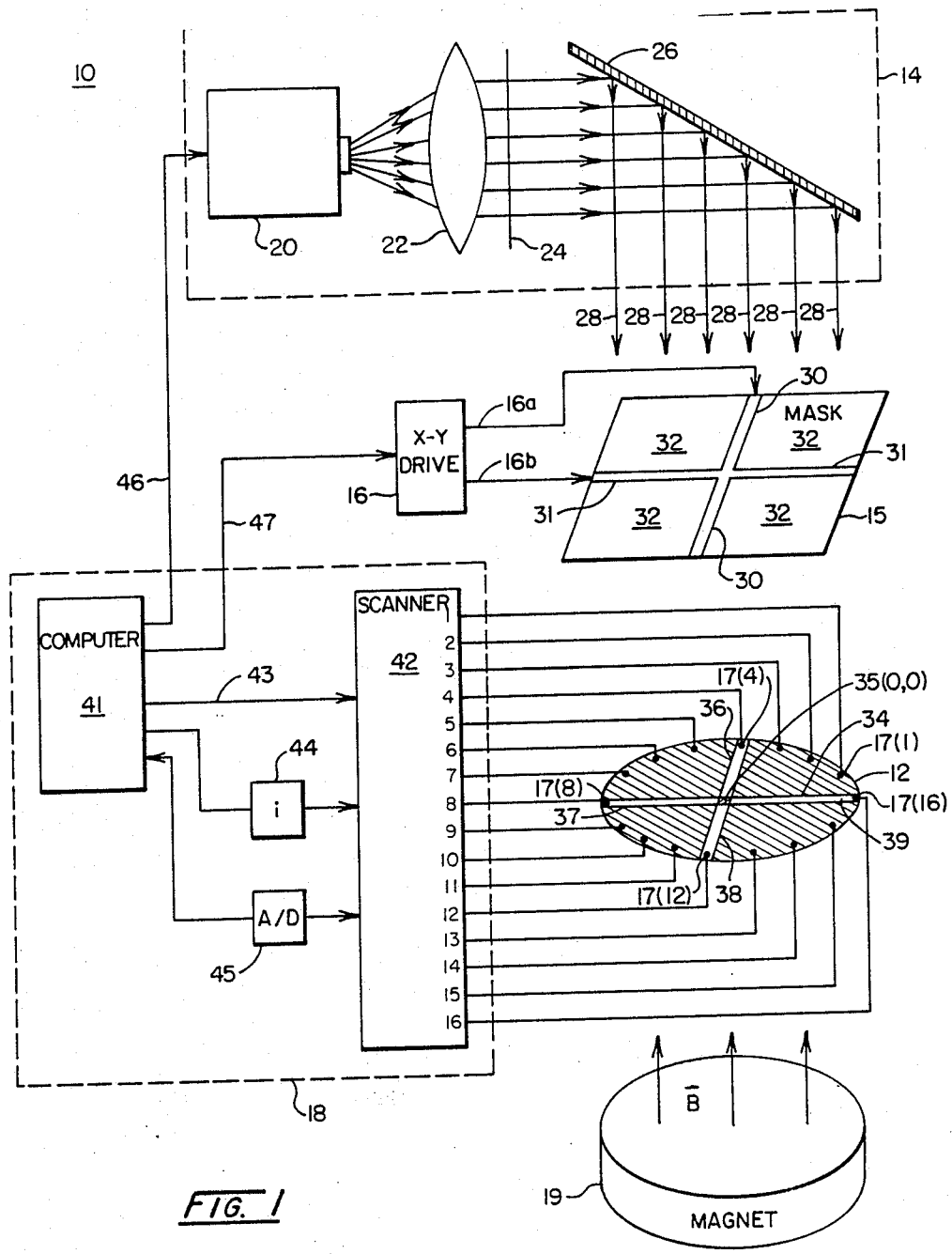
FIG. 1 is a schematic of apparatus for measuring characteristics of a semiconductor wafer in accordance with the present invention.

Referring to FIG. 1, apparatus indicated generally at 10 is adapted to measure the characteristics of a photoconductive semiconductor wafer 12. The apparatus comprises light means 14, masking means 15 interposed between the wafer 12 and light means 14, drive means 16 connected to the mask means 15, contact means 17(x) removably connected to the periphery of the wafer 12, control means 18 having inputs connected to each of the contact means 17(x), and magnetic means 19 adjacent the wafer 12. The semiconductor wafer 12 can be any semi-insulating (SI), photoconductive semiconductor material. For example, the wafer can be semi-insulating gallium arsenide (SI GaAs), containing EL2 or Cr, Fe doped InP, ZnSe, CdS, or resistive silicon. The following description, however, relates to measuring the characteristics of EL2.

The light means 14 directs light of substantially uniform intensity toward the upper surface of the wafer 12. The light can be incoherent light of coherent light from a laser. In the present embodiment, the light means 14 comprises a 600-watt tungsten lamp 20, a lens 22, a silicon filter 24 and a reflector 26. The light from the lamp 20 is collimated by the lens 22 which transmits the light through the silicon filter 24 to the reflector 26. The reflector 26 directs the light through the masking means 15 to the upper surface of the wafer 12 as indicated by arrows 28. The lens 22 collimates the light so that it is substantially uniform over the masking means 15. The silicon filter 24 is used in conjunction with the analysis of EL2 because it cuts off light having a wavelength less than 1.0 $\mu$m. The absorptive wavelength of GaAs is about 0.86 $\mu$m which means that light having shorter wavelength is absorbed near the surface of the wafer 12, while light having a longer wavelength is largely transmitted through the wafer 12. As the wavelength of the incident light 28 increases from the absorptive wavelength, the light 28 penetrates deeper into the GaAs wafer 12 so that most of the incident light is transmitted through the wafer 12 when the wavelength exceeds 1.0 $\mu$m. Thus, the depth of penetration into the wafer 12 or the thickness of the volume being measured, t, can be controlled by adjusting the wavelength of light. In the preferred embodiment, however, the wavelength is adjusted to exceed 1.0 $\mu$m, which causes the light to be transmitted through the wafer 12 making it equal to its actual dimensional thickness, because light 28 having a wavelength of 1.1 $\mu$m is required to excite the EL2 centers so that their characteristics can be measured.

The masking means 15 comprises a pair of substantially perpendicular, transparent slits 30,31 in an opaque material 32 aligned in a plane substantially parallel to the wafer 12. The light 28 is transmitted through the slits 30,31 to the wafer in a shape of a cross 34 which is formed by a pixel of light 35 at the intersection of the cross 34 and four paths of light or legs of light 36–39 extending outwardly from the pixel 35 to the periphery of the wafer 12. The slits 30,31 are typically 6.0 mm wide, so that the pixel of light 35 of approximately 36 mm². The pixel of light 35 illuminates the surface of a portion 35(X,Y) of the wafer 12, where a first portion 35(O,O) is shown at the origin (O,O) of an X-Y coordinate system. These portions 35 (X,Y) are defined by the projection of the pixel of light 35 through the wafer 12 and constitute the active region in which the EL2 centers are being measured. The characteristics of these portions 35 (X,Y) of the wafer 12 are measured nondestructively by virtue of the four paths of light 36–39 which provide a photoconductive connection to the periphery of the wafer 12. Essentially, the current flow is confined to the photoconductive paths 36–39 on the semi-insulating surface of the wafer 12 and ultimately to the contact means 17(x).

The drive means 16 is mechanically connected to the masking means 15 by linkage 16a and 16b for moving the slits 30,31 laterally so that the pixel of light 35 illuminates successive portions 35(X,Y) of the wafer 12. The wafer 12 has a diameter of about 3.0 inches and the drive means 16 is capable of moving the pixel of light 35 to any coordinate position on the surface of the wafer. The drive means 16 can be, for example, a stepper-motor assembly which provides translational motion in two directions or a device, such as for example, Model No. 855C supplied by the Newport Corporation.

The magnetic means 19 applies a substantially uniform magnetic field to the other surface of the wafer 12 so that the magnetic field B is substantially perpendicular thereto. The magnetic means 19 can be, for example, a flat, cyclindrical permanent magnet having approximately the same diameter as the wafer 12 and a thickness of about one half inch. The permanent magnet 19 provides a magnetic field of about 1–2 kG of sufficiently uniform intensity. A permanent magnet of this type is supplied by the Permag Corporation. In order to provide a sufficiently uniform magnetic field, it is preferable that the wafer 12 be positioned on or very close to the flat surface of the magnet 19.

In order to measure the characteristics of each portion 35(X,Y), or active region, of the wafer 12 the contact means 17(x) are positioned around periphery of the wafer 12. The contact means 17(x) can be, for example, small dots of silver paste or small dots of indium soldered to the periphery of the wafer 12, indium contacts being used as the contact means 17(x) in the preferred embodiment. After testing, the indium contacts 17(x) are easily removed prior to processing and fabrication by applying a small amount of pressure to the small dot. A small amount of residue does remain after the indium contacts 17(x) are removed, but the residue does not inhibit subsequent processing or fabrication since only the periphery of the wafer 12 is affected. Furthermore, the periphery of the wafer 12 is not used as a substrate for the eventual fabrication of circuit elements or other devices thereon. Since th indium contacts 17(X) can be removed prior to processing and do not interfere with processing or fabrication, the technique of the present invention is non-destructive.

The indium contacts 17(X) are ohmic, but need not be alloyed because the wafer 12 has a semi-insulating surface rather than a highly conductive surface. The indium contacts 17(x) function as "electrical contacts" for the paths of light 36-39 when illuminated thereby and the paths of light 36-39 provide the conductive path on the semi-insulating surface to the first portion 35(O,O) of the wafer 12. Thus, four electrical contacts 17(x) are needed to measure the electrical characteristics of each portion 35(X,Y) of the wafer 12 as shown in FIG. 1; electrical contacts 17(4), 17(8), 17(12), 17(16) are connected via conductive legs 36-39, respectively, to the first portion 35(O,O) of the wafer 12. There are enough electrical contacts 17(x) positioned on the periphery of the wafer 12 to provide a set of contacts for each coordinate to which the pixel of light 35 is moved. In the present embodiment shown, 16 electrical contacts 17(x=1 to 16) are used.

The control means 18 comprises a computer 41, a scanner 42 connected to the computer 41 by a digital bus 43, a current source 44 and an analog-to-digital converter 45. The current source 44 is controlled by the computer 41 to provide current to the scanner 42 that is variable over a range of 1.0 to $10^{-4}$ μA. The current source 44 can be, for example, Model No. K-220 supplied by Keithley Instruments. The analog-to-digital converter 45 is connected to an analog output of the scanner 42 and provides the digital equivalent of the analog signal to the computer 41. The analog-to-digital converter 45 can be, for example, Model No. K-197 also supplied by Keithley Instruments. The scanner 42 has 16 outputs 42(1-16) connected to the corresponding number of electrical contacts 17(1-16). The scanner 42 is controlled by the computer 41 to select the appropriate foursome of contacts 17(X) to measure the characteristics of a selected portion 35(X,Y) of the wafer 12. The scanner 42 can be, for example, Model No. K-705 or K-706 supplied by Keithley Instruments which includes a set of instructions showing how to program the computer 41 and scanner 42 with a high-level language. The computer 41 is also connected to the tungsten lamp 20 via a wire 46 to control the intensity of the light 28 and to the drive means 16 via a wire 47. Computer 41 controls the movement of the slits 30,31 to position the pixel of light 35 at the desired coordinate to measure the characteristics of successive portions 35(X,Y) of the wafer 12.

Figure 2:
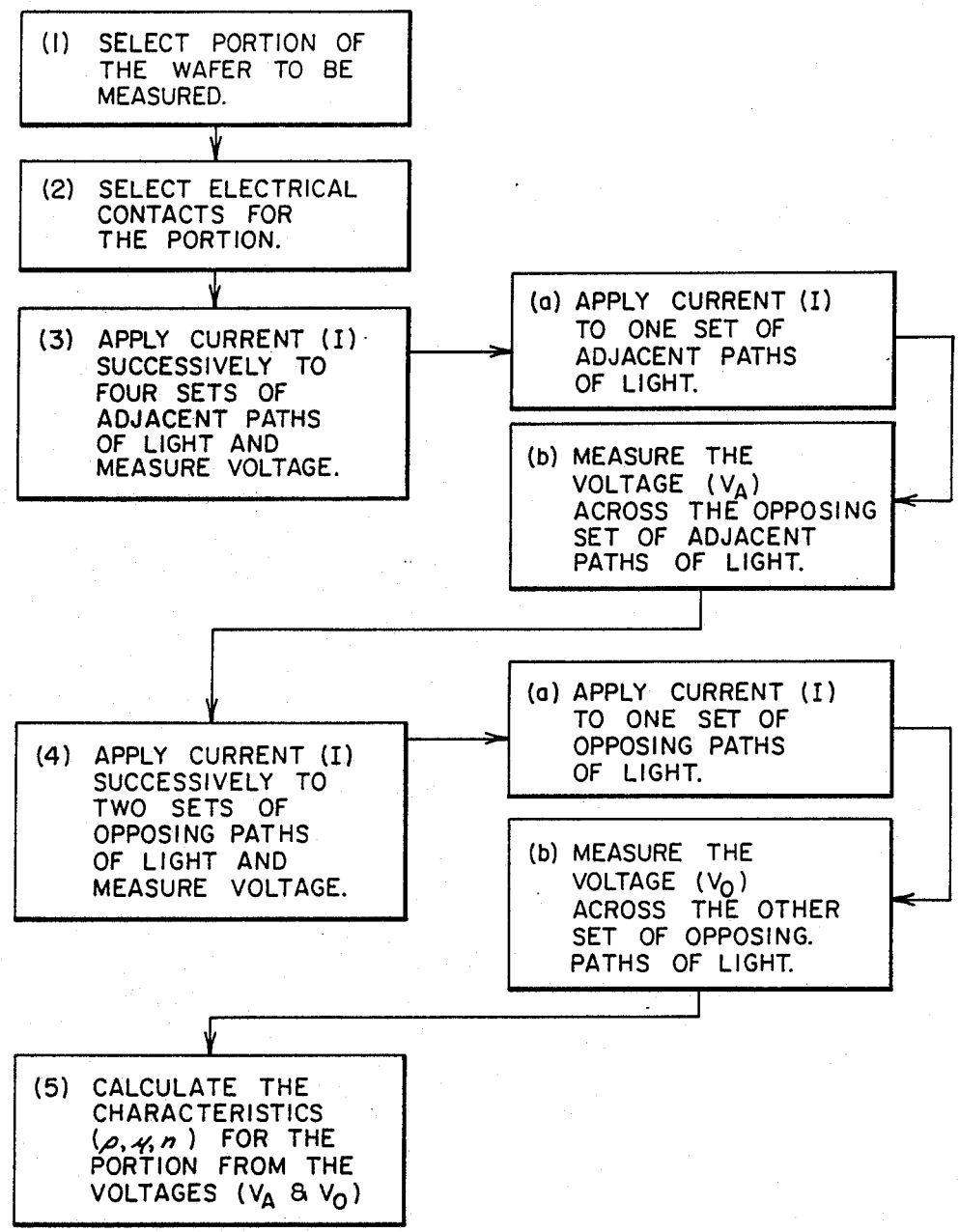
FIG. 2 is a Warnier-Orr diagram of a computer program used with the apparatus.

In operation, the computer 41 is programmed to execute the following five steps of a PROGRAM, shown in FIG. 2, to measure the characteristics, i.e., the resistivity ($\rho$), mobility ($\mu$), and carrier concentration (n), for each portion 35 (X,Y) of the wafer 12. In step (1), the computer 41 instructs the drive means 16 to move the slits 30,31 in order to position the pixel of light 35 at the desired coordinate, in this case the first portion 35(O,O) of the wafer 12. In step (2), the computer 41 instructs the scanner 42 to select the appropriate electrical contacts 17(x) for measuring the characteristics of the active region of the first portion 35(O,O), in this case electrical contacts 17(4), 17(8), 17(12) and 17(16). In step (3), the computer 41 instructs the scanner 42 to apply a fixed current (I) from the current source 44 successively to each of four sets of adjacent paths of light and measure the voltage across the opposing set of adjacent paths ($V_A$) in response to each application of current (I). Thus, step (3) comprises the steps of (a) applying the current (I) to a first set of adjacent paths of light, e.g., 36 and 37, and (b) measuring the voltage ($V_A$) across the opposing set of adjacent paths of light, e.g., 38 and 39, in response to the application of current (I) and repeating steps (a) and (b) for each of the remaining three sets of adjacent paths of light as represented by the bracket enclosing steps 3(a) and 3(b).

In step (4), which is not necessarily required to follow step (3), the computer 41 instructs the scanner 42 to apply the current (I) to each of two sets of opposing paths of light and measure the voltage across the other set of opposing paths of light ($V_O$) in response to each application of current (I). Thus, step (4) comprises the steps of (a) applying the current (I) to a first set of opposing paths of light, e.g. 36 and 38, and (b) measuring the voltage $V_O$) across the other set of opposing paths of light, e.g., 37 and 39, in response to the application of current (I), and repeating steps (a) and (b) for the remaining set of opposing paths of light as represented by the bracket enclosing steps 4(a) and 4(b). It should be understood that the current (I) is applied and the voltages ($V_A$ and $V_O$) are measured via the appropriate pair of electrical contacts from among the four electrical contacts 17(4), 17(8), 17(12) and 17(16) selected and that the foregoing description could be couched in terms referring to the electrical contacts rather than the paths of light.

In step (5), the computer 41 uses the applied current (I) and the measured voltages ($V_A$ and $V_O$) to calculate the individual adjacent and opposing resistances for each meaurement and ultimately the characteristics ($\rho$, $\mu$, n) of the first portion 35(O,O) of the wafer 12 being tested, which will be described in more detail by way of example hereinbelow. The computer 41 calculates the individual adjacent and opposing resistances by dividing the measured voltage ($V_A$ and $V_O$) by the applied current (I) or more simply calculates an average adjacent resistance ($R_A$) and an average opposing resistance ($R_O$) as defined hereinbelow by Equations I and II. Step (1) to (5) are repeated for successive portions 35(X,Y) of the wafer 12, as represented by the bracket enclosing them, to generate a data base comprising the measured voltages and calculated resistances and characteristics for each portion 35(X,Y) of the wafer 12.

Figure 3:
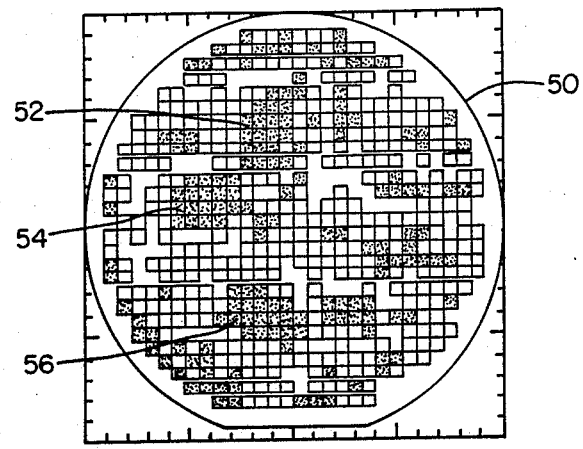
FIG. 3 is a map illustrating one of the characteristics across the surface of the wafer.

The computer 41 is also programmable to use the database to generate a topographical map for each characteristic across the entire surface of the wafer 12, such as that shown at 50 in FIG. 3. Different graphic symbols, e.g., different shadings or colors, are used to represent separate magnitude ranges for the specific characteristic being mapped. The map comprises a plurality of graphic symbols, each corresponding to the measured value of the characteristic for the corresponding portion 35(X,Y) of the wafer 12 and positioned at the corresponding coordinate (X,Y). The map 50 provides a picture of the cross-sectioned homogeneity of volume-related characteristics ($\rho$, $\mu$, n) which were heretofore unavailable. Such maps are extremely useful for identifying lateral inhomogeneity of the wafer 12 to determine whether the wafer 12 can be used as a substrate on which a large scale integrated circuit can be manufactured. Such defective portions, for example, are shown at 52, 53 and 54 in FIG. 3. The resolution of the map 50 is limited only by the number of electrical contacts 17($x$) that can be positioned around the periphery of the wafer 12.

Figure 4:
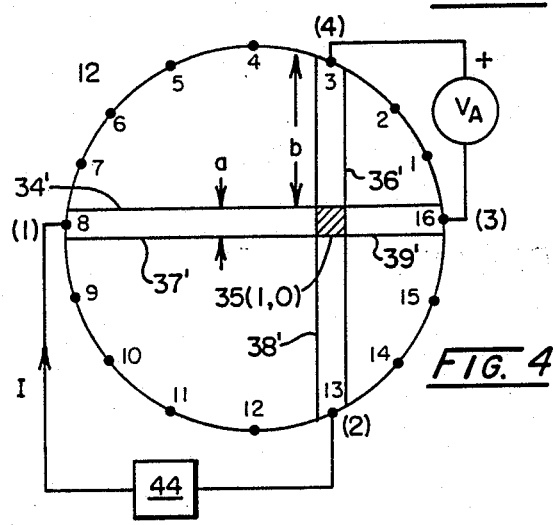
FIG. 4 is an enlarged schematic plan view of the wafer of FIG. 1.
Figure 5:
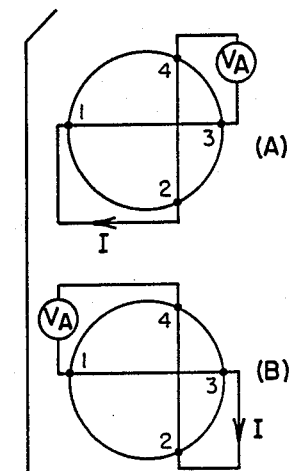
FIG. 5 includes four schematics of the wafer of FIG. 2 connected to measure photoresistivity.

Referring more specifically to FIG. 4, an enlarged schematic plan view of the wafer 12 of FIG. 1 is shown with electrical contacts 17(1) to 17(16) being numbered simply as 1–16 for convenience. The pixel of light 35 is shown repositioned to illuminate a second portion 35(1,0) of the wafer 12 at the coordinate (1,0) so that the cross of light 34' comprises paths of light 36' to 39'. These paths are electrically connected to the scanner 42 by the electrical contacts 17(3), 17(8), 17(13) and 17(16), respectively, which have been numbered (1) to (4) for convenience. The cross of light 34' is commonly referred to as a Greek cross configuration for which the Van der Pauw formula can be used to calculate the photoresistivity ($\rho$) of the second portion 35(1,0) according to Equation I.

Equation I: $\rho = \pi t R_A / \ln 2$, where
$R_A = [V_A(21,34) + V_A(32,41) + V_A(43,12) + V_A(14,23)]/4I$.

The letter "t" represents the thickness or depth of the active region of the second portion 35(1,0) being measured. The current (I) is applied to each of the four sets of adjacent paths of light as described above with respect to step 3(a) of FIG. 2 by means of corresponding pairs of electrical contacts indicated generally by (i) and (j) and specifically in Table A. The four adjacent voltages ($V_A$) are measured across each of the opposing sets of adjacent paths of light as described above with respect to step 3(b) of FIG. 2 by means of corresponding pairs of electrical contacts indicated generally by (k) and (l) and specifically in Table A. Thus, each of the four measured adjacent voltages ($V_A$) is represented by $V_A(ij,kl)$, the voltage induced across electrical contacts (k) and (l) by current flowing between electrical contacts (i) and (j), and the corresponding circuit for each shown in FIGS. 5A to 5D as indicated in Table A.

TABLE A

| FIGS. | Adjacent Current (I) Contacts (i,j) | Adjacent Voltage ($V_A$) Contacts (k,l) | Measured Adjacent Voltages |
|---|---|---|---|
| 4 & 5A | 21 | 34 | 0.79420 |
| 5B | 32 | 41 | 0.80708 |
| 5C | 43 | 12 | 0.77915 |
| 5D | 14 | 23 | 0.77701 |
| | | | 3.15744 |

When the voltage ($V_A$) is measured, the polarity of contact (i) should match the polarity of contact (l) and similarly for contacts (j) and (k). It should also be understood that the individual adjacent resistances, $R_A(ij,lk)$, can also be calculated by dividing the corresponding voltage, $V_A(ij,lk)$, by the applied current (I). The average adjacent resistance ($R_A$) is the average of the individual adjacent resistances. To obtain accurate measurements, it is necessary to keep the length of each path of light larger than the corresponding width, i.e., (b) is greater than (a) as shown in FIG. 4. As the pixel of light 35 moves away from the origin (O,O) toward the periphery of the wafer 12, the length of the paths 36' to 39' are no longer symmetrical. Such symmetrical errors will be small as long as b/a is greater than 1 for all four paths of light 36' to 39'. All of this taken into consideration, the measured adjacent voltages V(ij,kl) listed in Table A were obtained when the scanner 42 applied a current (I) of about 0.3 $\mu$A to the wafer 12 having a given thickness (t) of about $5.9 \times 10^{-2}$ cm. Accordingly, the average adjacent resistance ($R_A$) was calculated to be about 2.6 megohms and the resistivity ($\rho$) was calculated to be about 0.7 megohm-cm according to Equation I.

When a magnetic field B is applied to the wafer 12, the photo-Hall coefficient ($R_H$) can also be calculated for the second portin 35(1,0) of the wafer 12 to determine the defect mobility ($\mu$) and the defect concentration (n) of the active region according to Equations II, III, and IV.

Equation II: $R_H = tR_0 \times 10^8/B$, where
$R_0 = [V(31,42) + V(42,13)]/2I$;
Equation III: $\mu = R_H/\rho$; and Equation IV: $n = 1/eR_H$.

Figure 6:
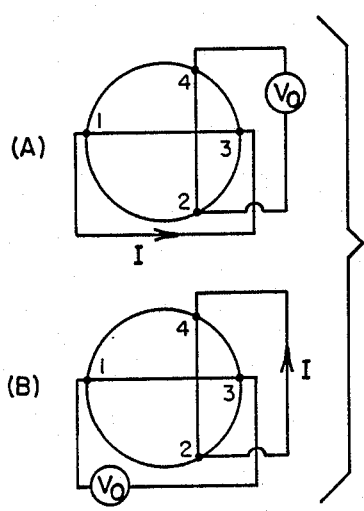
FIG. 6 includes two schematics of the wafer of FIG. 2 connected to measure photo-Hall-effect characteristics.

The letter "e" is the electron charge of $1.6 \times 10^{-19}$ coulomb. The current (I) is applied to each of the two sets of opposing paths of light as described above with respect to step 4(a) of FIG. 2 by means of corresponding pairs of electrical contacts indicated generally by (i) and (j) and specifically in Table B. The two opposing voltages ($V_O$) are measured across the other set of opposing paths of light as described above with respect to step 4(b) of FIG. 2 by means of corresponding pairs of electrical contacts indicated generally by (k) and (l) and specifically in Table B. Thus, each of the two measured opposing voltages ($V_O$) is represented by $V_O(ij,kl)$, the voltage induced across electrical contacts (k) and (l) by current flowing between electrical contacts (i) and (j), and the corresponding circuit for each shown in FIGS. 6A and 6B as indicated in Table B.

TABLE B

| FIG. | Opposing Current (I) Contacts (i,j) | Opposing Voltae $V_O$ Contacts (k,l) | Measured Opposing Voltages |
|---|---|---|---|
| 6A | 31 | 42 | 0.21072 |
| 6B | 42 | 13 | 0.25976 |
| | | | 0.47048 |

The individual opposing resistances, $R_O(ij,kl)$, can also be calculated by dividing the corresponding voltage, $V_O(ij,kl)$ by the applied current (I). The average opposing resistance ($R_O$) equals the average value of individual opposing resistances. Using the same example as above, and applying a magnetic field (B) of about 1000 gauss, the average opposing resistance ($R_O$) is about 0.78 megohms. The Hall-coefficient ($R_H$) is about $4.6 \times 10^9$ cm$^3$/coulomb when the value of 0.78 megohms is inserted into Equation II. Both the mobility ($\mu$) and defect concentration (n) can be calculated when inserting the Hall-coefficient ($R_H$) into Equation III and IV. The photo-resistivity, mobility and carrier concentration can be calculated for each portion 35(X,Y) of the wafer 12 and used to form a topographical map for each characteristic as described above.

In addition to obtaining information related to the characteristics of individual portions 35(X,Y) of the wafer 12, it is also desirable to obtain information related to the average values of the resistivity, mobility, and carrier concentration, for the entire lateral surface of the wafer 12. Such measurements could be used in standard manufacturer acceptance testing. Referring to FIG. 1, the apparatus would not include the masking means 15. Furthermore, only four electrical contacts at generally equidistant positions on the periphery of the wafer would be required, e.g., electrical contacts 17(4), 17(8), 17(12), and 17(16). The adjacent voltages ($V_A$) and opposing voltages ($V_O$) are measured as described hereinabove to obtain the average value of the characteristics for the entire wafer 12. The value of these average characteristics is calculated in the same fashion as described hereinabove.

The voltage measurements are made twice under two separate conditions: a "light" condition and a "dark" condition. The former is accomplished when the magnetic field (B) is applied to one side of the wafer 12 and the light 28 illuminates the other side of the wafer 12. As a result, a set of average light characteristics is calculated: the average light resistivity, the average light carrier mobility and the average light carrier concentration. The latter is accomplished when the light 28 is not applied to the other side of the wafer 12. As a result, a set of average dark characteristics is calculated: the average dark resistivity, the average dark carrier mobility and the average dark carrier concentration. It should be understood that the average dark characteristics can be determined for a wafer that is not photoconductive because the magnetic field (B) is applied to the wafer 12 without illuminating the other side with the light 28. Both the light and dark average characteristics would be used for comparison to industry-developed standards for effecting quality control. Such standards have not yet been developed.

Having described the invention in detail and by way of reference to preferred embodiments thereof, it will be apparent that other modifications and variations are possible without departing from the scope of the invention defined in the appended claims.

What is claimed is:

1. Apparatus adapted to measure the characteristics of a photoconductive semiconductor wafer, said apparatus comprising:
   light means for directing light of substantially uniform intensity toward one surface of the wafer;
   masking means, interposed between the wafer and said light means, for transmitting said light to the wafer in the shape of a cross formed by a pixel of light at the intersection of said cross and four paths of light extending outwardly from said pixel to the periphery of the wafer;
   a first set of contact means, each removably connected to a position on the periphery of the wafer and illuminated by one of said four paths of light, for providing electrical contact with said paths of light; and,
   control means, having separate inputs connected to each of said contact means of said first set, for applying current successively to each of four sets of adjacent paths of light and measuring the voltage across an opposing set of adjacent paths in response to each application of current;
   whereby the resistivity of a first portion of the wafer illuminated by the projection of said pixel of light through the wafer is determined.

2. Apparatus as recited in claim 1, wherein said light has a wavelength greater than the absorptive wavelength of the material which comprises the wafer.

3. Apparatus as recited in claim 1, wherein said control means further comprises computer means for calculating an adjacent resistance associated with each of the four sets of adjacent paths of light by dividing the measured voltage by the applied current and calculating the resistivity of the first portion of the wafer by multiplying the average of the adjacent resistances by a factor of $\pi t/\ln 2$, where t is the thickness of the wafer.

4. Apparatus as recited in claim 1, wherein said first set of contact means are indium soldered to the periphery of the wafer.

5. Apparatus as recited in claim 1, wherein said masking means comprises a pair of substantially perpendicular, transparent slits in an opaque material to form said cross of light, each slit being movable in a plane substantially parallel to the wafer, and further comprising:
   drive means, having an input electrically connected to said control means and an output mechanically connected to said masking means, for moving said slits so that said pixel of light illuminates successive portions of the wafer; and,
   successive sets of contact means, associated with each successive portion of the wafer, each removably connected to a position on the periphery of the wafer and illuminated by one of said four paths of light for providing electrical contact therewith and each connected to said control means for applying current to and measuring voltage across said four paths of light associated with each successive portion of the wafer in the same manner as done for the first portion of the wafer;
   whereby, a map of the resistivities of the surface of the wafer is generated.

6. Apparatus as recited in claim 1, further comprising magnetic means for applying a substantially uniform magnetic field to the other surface of the wafer, and wherein said control means applies current successively to each of two sets of opposing paths of light and measures the voltage across the other set of opposing paths of light in response to each application of current, whereby the carrier mobility and carrier concentration of the first portion of the wafer are determined.

7. Apparatus as recited in claim 6, wherein said control means further comprises computer means for calculating an adjacent resistance associated with each of the four sets of adjacent paths of light and an opposing resistance associated with each of the two sets of opposing paths of light by dividing the measured voltage by the applied current, for calculating the resistivity of the first portion of the wafer by multiplying the average of the adjacent resistances by a factor of $\pi t/\ln 2$, where t is the thickness of the wafer, and for calculating the Hall coefficient of the first portion of the wafer by multiplying the average of the opposing resistances by a factor of $10^8 t/B$, where B is the magnitude of the magnetic field, whereby the carrier mobility and carrier concentration are determined.

8. Apparatus as recited in claim 7, wherein said computer means calculates the carrier mobility by dividing the Hall coefficient by the resistivity.

9. Apparatus as recited in claim 7, wherein said computer means calculates the carrier concentration by taking the inverse of the product of the Hall coefficient and an electron charge.

10. Apparatus as recited in claim 6, wherein said masking means comprises a pair of substantially perpendicular, transparent slits in an opaque material to form said cross of light, each slit being movable in a plane substantially parallel to the wafer, and further comprising:

drive means, having an input electrically connected to said control means and an output mechanically connected to said masking means, for moving said slits so that said pixel of light illuminates successive portions of the wafer; and successive sets of contact means associated with each successive portion of the wafer, each removably connected to a position on the periphery of the wafer and illuminated by one of said four paths of light, for providing electrical contact therewith and each connected to said control means for applying current to and measuring voltage across said four paths of light associated with each successive portion of the wafer in the same manner as done for the first portion of the wafer;

whereby, a map of the carrier mobilities for the surface of the wafer is generated.

11. Apparatus as recited in claim 6, wherein said masking means comprises a pair of substantially perpendicular, transparent slits in an opaque material to form said cross of light, each slit being movable in a plane substantially parallel to the wafer, and further comprising:

drive means, having an input electrically connected to said control means and an output mechanically connected to said masking means, for moving said slits so that said pixel of light illuminates successive portions of the wafer; and successive sets of contact means associated with each successive portion of the wafer, each removably connected to a position on the periphery of the wafer and illuminated by one of said four paths of light, for providing electrical contact therewith and each connected to said control means for applying current to and measuring voltage across said four paths of light associated with each successive portion of the wafer in the same manner as done for the first portion of the wafer;

whereby, a map of the carrier concentrations for the surface of the wafer is generated.

12. Apparatus adapted to measure the characteristics of a photoconductive semiconductor wafer, said apparatus comprising:

light means for directing light for substantially uniform intensity toward one surface of the wafer;

masking means, interposed between the wafer and said light means, for transmitting said light to the wafer in the shape of a cross formed by a pixel of light at the intersection of said cross and four paths of light extending outwardly from said pixel to the periphery of the wafer;

a first set of contact means, each removably connected to a position on the periphery of the wafer and illuminated by one of said four paths of light, for providing an electrical contact with said paths of light; and, control means, having separate inputs connected to each of said contact means of said first set, for applying current successively to each of two sets of opposing paths of light and measuring the voltage across an other set of opposing paths of light in response to each application of current;

whereby the Hall coefficient of a first portion of the wafer illuminated by the projection of the pixel light through the wafer is determined.

13. Apparatus as recited in claim 12, wherein said first set of contact means are indium soldered to the periphery of the wafer.

14. Apparatus as recited in claim 12, wherein said masking means comprises a pair of substantially perpendicular, transparent slits in an opaque material to form said cross of light, each slit being movable in a plane substantially parallel to the wafer, and further comprising:

drive means, having an input electrically connected to said control means and an output mechanically connected to said masking means, for moving said slits so that said pixel of light illuminates successive portions of the wafer, and, successive sets of contact means, associated with each successive portion of the wafer, each removably connected to a position on the periphery of the wafer and illuminated by one of said four paths of light for providing electrical contact therewith and each connected to said control means for applying current to and measuring voltage across said four paths of light associated with each successive portion of the wafer in the same manner as done for the first portion of the wafer;

whereby, a map of the Hall coefficients for the surface of the wafer is generated.

15. Apparatus as recited in claim 12, wherein said control means further comprises computer means for calculating an opposing resistance associated with each of the two sets of opposing paths of light by dividing the measured voltage by the applied current, and for calculating the Hall coefficient of the first portion of the wafer by multiplying the average of the opposing resistances by a factor of $10^8 t/B$, where t is the thickness of the wafer and where B is the magnitude of the magnetic field.

16. A method for measuring characteristics of a photoconductive semiconductor wafer, comprising the steps of:

illuminating one surface of the wafer with a cross of light of substantially uniform intensity formed by a pixel of light at the intersection of the cross and four paths of light extending outwardly therefrom to the periphery of the wafer at a first set of electrical contacts connected to the wafer;

applying current successively to the electrical contacts of the first set of electrical contacts for each of four sets of adjacent paths of light; and, measuring the voltage across the electrical contacts of an opposing set of adjacent paths of light in response to each application of current in order to determine the resistivity of a first portion of the wafer illuminated by the projection of the pixel of light through the wafer.

17. The method as recited in claim 16, wherein the wavelength of the light being greater than the absorptive wavelength of the material which comprises the wafer.

18. The method as recited in claim 16, further comprising the seps of computing an adjacent resistance associated with each of the four sets of adjacent paths of light by dividing the measured voltage by the applied current and computing the resistivity of the first portion of the wafer by multiplying the average of the adjacent resistances by a factor of $\pi t/\ln 2$, where t is the thickness of the wafer.

19. The method as recited in claim 16, further comprising the steps of moving the cross of light so that the pixel of light illuminates successive portions of the wafer and repeating all of the previous steps for each successive portion to generate a map of the resistivities for the surface of the wafer.

20. The method as recited in claim 16, further comprising the steps of:
applying a substantially uniform magnetic field to the other surface of the wafer;
applying current successively to the electrical contacts of the first set of electrical contacts for each of two sets of opposing paths of light; and,
measuring the voltage across the electrical contacts of the other set of opposing paths of light in response to each application of current in order to determine the carrier mobility and carrier concentration of the portion of the wafer illuminated by the projection of the pixel light.

21. The method as recited in claim 20, further comprising the steps of (a) computing an adjacent resistance associated with each of the four sets of adjacent paths of light and an opposing resistance associated with each of the two sets of opposing pairs of light by dividing the measured voltage by the applied current; (b) computing the resistivity of the first portion of the wafer by multiplying the average of the adjacent resistances by a factor of $\pi t/\ln 2$, where t is the thickness of the wafer; and (c) comprising the Hall coefficient of the first portion of the wafer by multiplying the average of the opposing resistances by a factor of $10^8 t/B$, where B is the magnitude of the magnetic field, to determine the carrier mobility and carrier concentration.

22. The method as recited in claim 21, further comprising the step of computing the carrier mobility by dividing the Hall coefficient by the resistivity.

23. The method as recited in claim 21, further comprising the step of computing the carrier concentration by taking the inverse of the product of the Hall coefficient and an electron charge.

24. The method as recited in claim 20, further comprising the steps of moving the cross of light so that the pixel of light illuminates successive portions of the wafer and repeating all of the previous steps for each portion to generate a map of the carrier mobilities for the surface of the wafer.

25. The method as recited in claim 20, further comprising the steps of moving the cross of light so that the pixel of light illuminates successive portions of the wafer and repeating all of the previous steps for each portion to generate a map of the carrier concentrations for the surface of the wafer.

26. A method for measuring characteristics of a photoconductive semiconductor wafer comprising the steps of:
illuminating one surface of the wafer with a cross of light of substantially uniform intensity formed by a pixel of light at the intersection of the cross and four paths of light extending therefrom to the periphery of the wafer at a first set of electrical contacts connected to the wafer;
applying a substantially uniform magnetic field to the other surface of the wafer;
applying current successively to the electrical contacts of the first set of electrical contacts for each of two sets of opposing paths of light; and,
measuring the voltage across the electrical contacts of an other set of opposing paths of light in response to each application of current in order to determine the Hall coefficient of a first portion of the wafer illuminated by the projection of the pixel light through the wafer.

27. The method as recited in claim 26, further comprising the steps of moving the cross of light so that the pixel of light illuminates successive portions of the wafer and repeating all of the previous steps for each successive portion to generate a map of the Hall coefficients for the surface of the wafer.

* * * * *